United States Patent
Lin et al.

(10) Patent No.: US 10,003,116 B1
(45) Date of Patent: Jun. 19, 2018

(54) ELECTRONIC APPARATUS HAVING COPLANAR WAVEGUIDE TRANSMISSION LINE

(71) Applicant: Novatek Microelectronics Corp., Hsinchu (TW)

(72) Inventors: Chun-Yi Lin, Taoyuan (TW); Yu-Jen Chen, Tainen (TW); Hung-Chi Chu, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/472,312

(22) Filed: Mar. 29, 2017

(51) Int. Cl.
- *H01L 21/02* (2006.01)
- *H01P 3/02* (2006.01)
- *H03H 7/01* (2006.01)
- *H01L 49/02* (2006.01)
- *H01L 23/66* (2006.01)

(52) U.S. Cl.
CPC ............. *H01P 3/026* (2013.01); *H01L 23/66* (2013.01); *H01L 28/40* (2013.01); *H03H 7/01* (2013.01); *H01L 2223/6672* (2013.01)

(58) Field of Classification Search
None
See application file for complete search history.

(56) References Cited

U.S. PATENT DOCUMENTS

| | | | | |
|---|---|---|---|---|
| 9,645,171 B1 * | 5/2017 | Lynch | ............... | G01R 1/00 |
| 2003/0184405 A1 * | 10/2003 | Ono | ............... | H01P 1/2013 333/33 |
| 2006/0158286 A1 * | 7/2006 | Lai | ............... | H01P 3/003 333/238 |
| 2011/0169576 A1 * | 7/2011 | Okuda | ............... | H01L 23/66 330/307 |
| 2014/0049862 A1 * | 2/2014 | Ma | ............... | H01L 23/60 361/56 |

* cited by examiner

*Primary Examiner* — Angel Roman
(74) *Attorney, Agent, or Firm* — JCIPRNET

(57) ABSTRACT

An electronic apparatus having a coplanar waveguide transmission line configured to reduce impedance discontinuity in the coplanar waveguide transmission line is introduced. The electronic apparatus includes a coplanar waveguide transmission line including a substrate, at least one signal line and a plurality of reference planes, and the electronic apparatus includes at least one passive component. Each of the reference planes is coupled to a DC voltage. The at least one passive component is electrically connected between the reference planes and acts as a short circuit at relatively high frequencies.

15 Claims, 4 Drawing Sheets

ELECTRONIC APPARATUS HAVING COPLANAR WAVEGUIDE TRANSMISSION LINE

BACKGROUND OF THE INVENTION

1. Field of the Invention

The disclosure generally relates an electronic apparatus having a coplanar waveguide transmission line, and more specifically to an electronic apparatus having a coplanar waveguide transmission line and having at least one passive component connected between reference planes of the coplanar waveguide transmission line for reducing impedance discontinuity in the coplanar waveguide transmission line.

2. Description of Related Art

In the field of signal transmission, coplanar waveguide (CPW) transmission lines have been used extensively because the CPW transmission lines provide a great circuit isolation. FIGS. 1A-1B show diagrams of conventional electronic apparatuses having CPW transmission lines, where a signal line 12 always comes with at least one reference plane which receives either a ground voltage or a power voltage of a direct current (DC) voltage source. Referring to FIG. 1A, the signal line 12 is disposed between a first reference plane 14 and a second reference plane 16, where each of the first reference plane 14 and the second reference plane 16 may receive either the ground voltage or the power voltage. The first and second reference planes 14, 16 are separated from the signal line 12 by a predetermined gap. Referring to FIG. 1B, one of the first reference plane 14 and the second reference plane 16 is disposed between the signal lines 12, where the reference plane disposed between the signal lines 12 may receive either the ground voltage or the power voltage of the DC voltage source.

However, due to imperfect manufacturing process and circuit designs, impedance discontinuity usually appears on the reference planes of the CPW transmission line, leading to signal reflection on the CPW transmission line and reduction in signal transmission efficiency.

Thus, it would be desirable to have an electronic apparatus which has capability of reducing the impedance discontinuity in the CPW transmission line.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY OF THE INVENTION

An electronic apparatus having a coplanar waveguide transmission line capable of reducing the impedance discontinuity in the coplanar waveguide transmission line is introduced herein.

The electronic apparatus includes a substrate, a coplanar waveguide transmission line, and a first passive component. The coplanar waveguide transmission line is disposed on a surface of the substrate and includes a signal line, a first reference plane and a second reference plane, wherein the first reference plane and the second reference plane are disposed at a first side of the signal line. The first passive component is disposed on the surface of the substrate and coupled between the first reference plane and the second reference plane. The first reference plane and the second reference plane are respectively coupled to a first direct current (DC) voltage and a second DC voltage.

In an exemplary embodiment of the disclosure, the electronic apparatus further includes a memory and a semiconductor chip. The semiconductor chip has a double data rate (DDR) memory interface and is able to access the memory via the DDR memory interface. The signal line of the coplanar waveguide transmission line connects one of a plurality of signal ports of the DDR interface of the semiconductor chip and a corresponding signal port of the memory.

In summary, the present disclosure provides a coplanar waveguide transmission line including a signal line disposed on the substrate by reference to at least two reference planes connected by a passive component. The passive component acts as a short circuit at relatively high frequencies. Such as that, the electronic apparatus may reduce the impedance variation and remain the impedance continuity in the coplanar waveguide transmission lines.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1A:
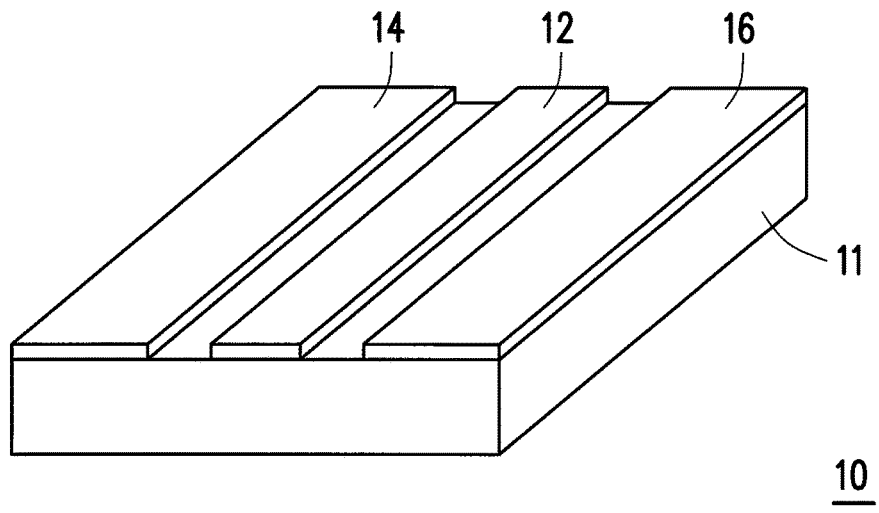
FIGS. 1A-1B are schematic diagrams illustrating electronic apparatuses in related arts.
Figure 1B:
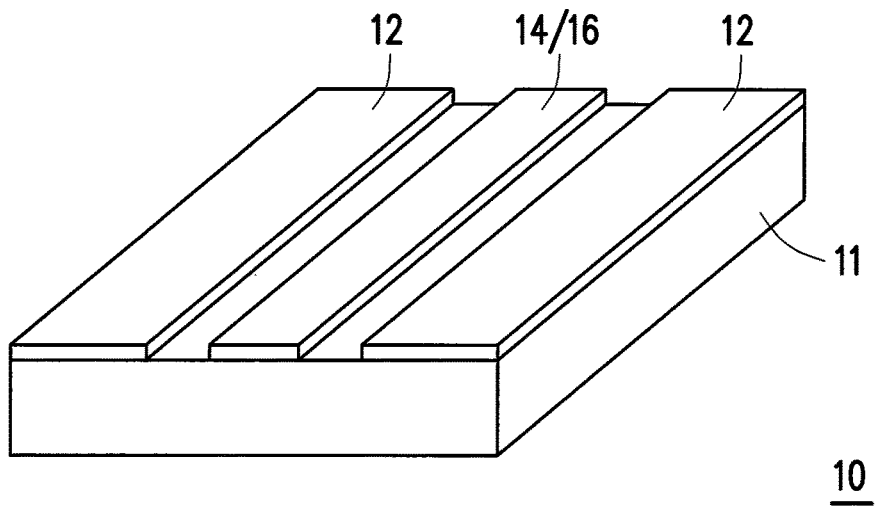
Figure 2:
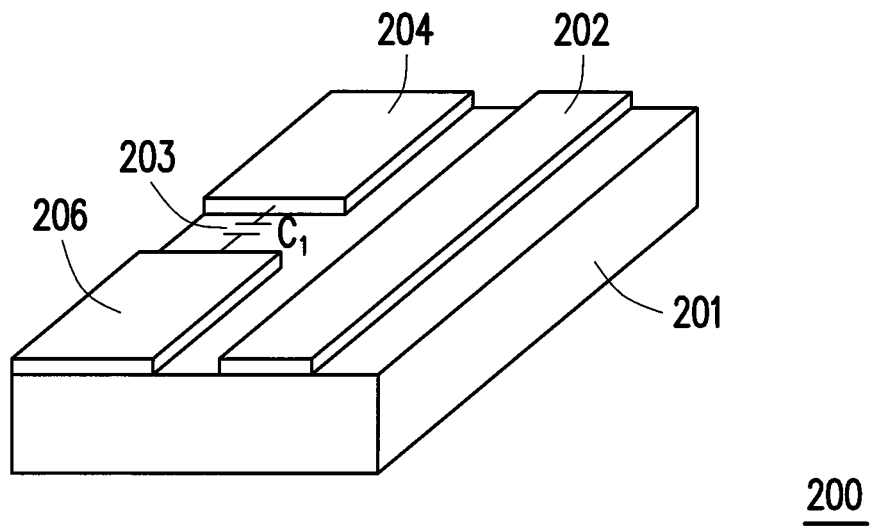
FIG. 2 is a schematic diagram illustrating an electronic apparatus according to an exemplary embodiment of the disclosure.

FIG. 2 is a schematic diagram illustrating an electronic apparatus according to an exemplary embodiment of the disclosure. In an embodiment of the disclosure, the electronic apparatus includes a substrate, a multi-reference coplanar waveguide (CPW) transmission line and at least one passive component (e.g., at least one capacitor, at least one diode, at least one inductor, or combinations thereof)

connected between the reference planes of the CPW transmission line so as to reduce the impedance discontinuity in the CPW transmission line.

Referring to FIG. 2, the electronic apparatus 200 includes a substrate 201, a CPW transmission line including a signal line 202, a first reference plane 204 and a second reference plane 206, and a passive component 203. The substrate 201 may be a dielectric substrate whose sizes (e.g., a width, a height, a thickness) may be set according to design requirements. The electronic apparatus 200 may include at least one integrated circuit (not shown) formed on the substrate 201 and having signal ports coupled to the signal line 202. The signal line 202, the first reference plane 204 and the second reference plane 206 of the CPW transmission line are all disposed on the same surface of the substrate 201. The passive component 203 is disposed on the same surface of the substrate as the CPW transmission line is disposed. In an embodiment of the disclosure, the first reference plane 204 and the second reference plane 206 are disposed on a same side (also referred to as a first side) of the signal line 202 and along a signal transmission direction of the signal line 202. The first reference plane 204 and the second reference plane 206 are respectively coupled to a first DC voltage and a second DC voltage, in which the first DC voltage may be equal to or different from the second DC voltage. For an example that is not intended to limit scope of the disclosure, the first reference plane 204 may receive a ground voltage (e.g., 0V) from a DC voltage source and the second reference plane 206 may receive a power voltage (e.g., 5V, 10V) from the DC voltage source, or vice versa. However, the disclosure is not limited thereto, both of the first reference plane 204 and the second reference plane 206 may receive a same DC voltage (e.g., 0V, 5V, 10V) in another embodiment. The ground voltage is set according to the design requirements and can be a ground voltage for digital circuits or a ground voltage for analog circuits.

The first passive component 203 is coupled between the first reference plane 204 and the second reference plane 206. In an embodiment of the disclosure, the first passive component 203 may include at least one capacitor, or at least one inductor, or at least one diode, or any combination thereof.

The first passive component 203 may act as a high-pass filter, a band-pass filter, or even a low-pass filter with a relatively high cut-off frequency (e.g., 1 Ghz, 2 Ghz). When a high-frequency signal is transmitted on the signal line 202, the first passive component 203 is equivalent to a short circuit connecting between the reference planes such that the first reference plane 204 is regarded as being short-circuited to the second reference plane 206, and thus remains the impedance continuity. In this way, the impedance discontinuity is significantly reduced and a signal transmission efficiency of the CPW transmission line is improved.

Figure 3A:
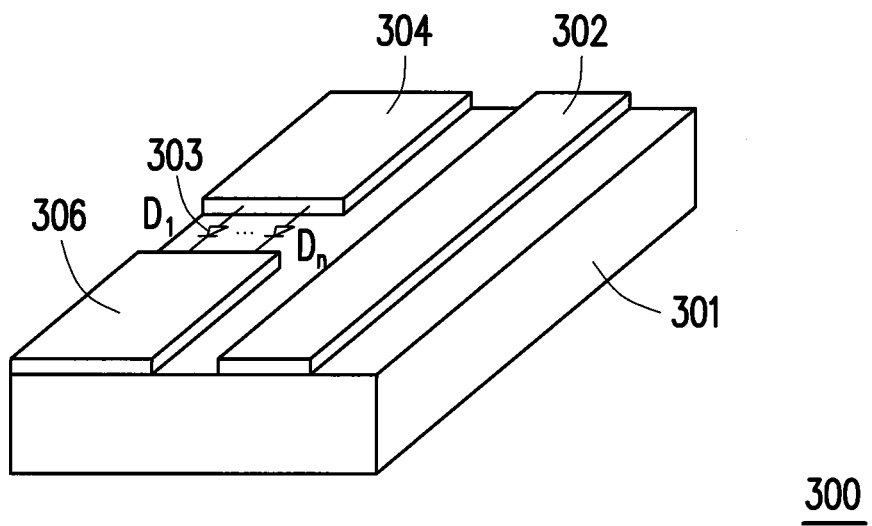
FIGS. 3A-3C are schematic diagrams illustrating electronic apparatuses according to different exemplary embodiments of the disclosure.
Figure 3B:
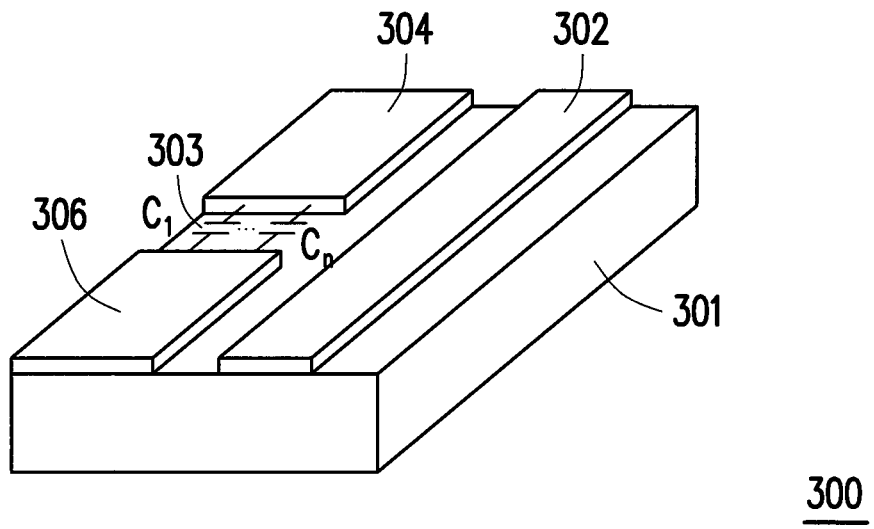
Figure 3C:
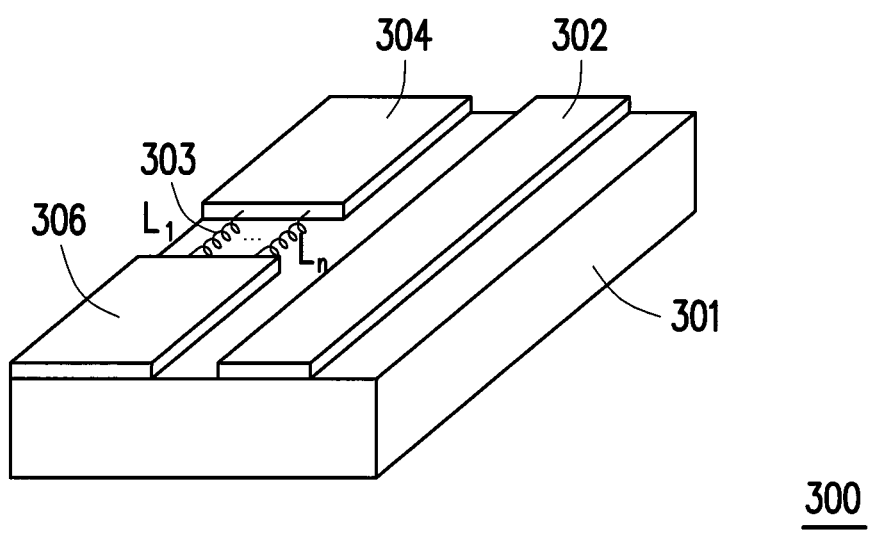

FIGS. 3A-3C are schematic diagrams illustrating electronic apparatuses according to different exemplary embodiments of the disclosure. Referring to FIGS. 3A-3C, the electronic apparatus 300 includes a substrate 301, a CPW transmission line including a signal line 302, a first reference plane 304 and a second reference plane 306, and the electronic apparatus 300 includes a passive component 303. A difference between the electronic apparatus illustrated in FIG. 2 and the electronic apparatus illustrated in FIGS. 3A-3C is the passive component 303. Referring to FIG. 3A, the passive component 303 includes at least one diode (D1 to Dn), and when a voltage level of the first DC voltage is lower than a voltage level of the second DC voltage, an anode of the at least one diode (D1 to Dn) is coupled to the first reference plane 304 and a cathode of the at least one diode (D1 to Dn) is coupled to the second reference plane 306. That is, the diode D1 to Dn may be reverse biased between the first reference plane 304 and the second reference plane 306. The at least one diode (D1 to Dn) may be connected to each other in series or in parallel or a combination thereof. The disclosure is not limited to the any type of diode, and the coupling relationships of the diode and the first and second reference planes may change accordingly to the type of the diode.

Referring to FIG. 3B, the passive component 303 includes at least one capacitor (C1 to Cn) which may be coupled to each other in series or in parallel or a combination thereof. The disclosure is not limited to the any type of capacitor, and the coupling relationships of the at least one capacitor with the first and second reference planes may change accordingly to the type of the capacitor and/or circuit design requirements.

Referring to FIG. 3C, the passive component 303 includes at least one inductor (L1 to Ln) which may be coupled to each other in series or in parallel or a combination thereof. The disclosure is not limited to the any type of inductor, and the coupling relationships of the at least one inductor with the first and second reference planes may change accordingly to the type of the inductors and/or circuit design requirements.

In another embodiment of the disclosure, the passive component 303 may be any combination of at least one capacitor, at least one inductor, and at least one diode. For example, the passive component 303 may be combinations of at least one capacitor with at least one inductor, combinations of at least one capacitor with at least one diode, combinations of at least one inductor with at least one diode. The constructive components (e.g., at least one capacitor, at least one inductor, at least one diodes, or a combination therefore) of passive component 303 may be connected to each other in series or in parallel or a combination thereof.

Figure 4:
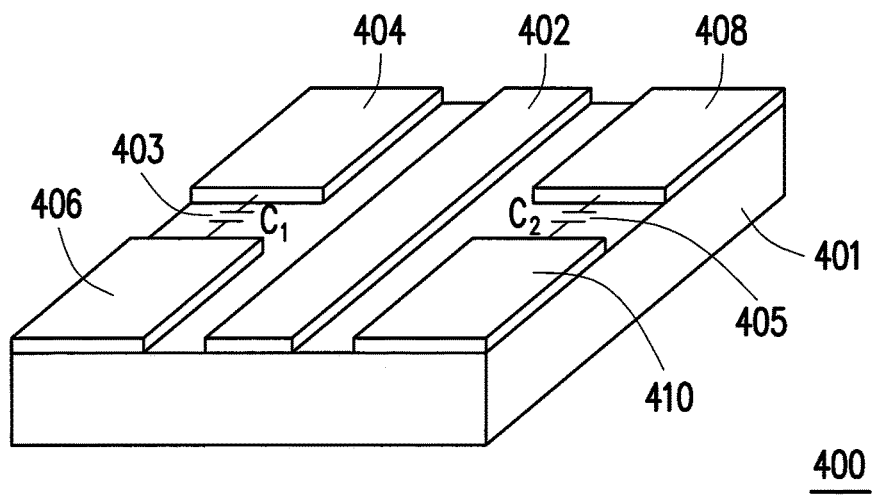
FIG. 4 is a schematic diagram illustrating an electronic apparatus according to an exemplary embodiment of the disclosure.

FIG. 4 is a schematic diagram illustrating an electronic apparatus according to another exemplary embodiment of the disclosure. Referring to FIG. 4, the electronic apparatus 400 includes a substrate 401, a CPW transmission line including a signal line 402, a first reference plane 404, a second reference plane 406, a third reference plane 408 and a fourth reference plane 410, and the electronic apparatus 400 includes a first passive component 403 and a second passive component 405. The electronic apparatus 400 may include at least one integrated circuit (not shown) formed on the substrate 401 and having signal ports coupled to the signal line 402. The substrate 401, the signal line 402, the first reference plane 404, the second reference plane 406, and the first passive component 403 are similar to those of FIG. 2, thus the related descriptions are omitted herein.

The third and fourth reference planes 408 and 410 are disposed on the substrate 401 and at a second side that is different from the first side of the signal line 402. For example, if the first side of the signal line 402 is a left-hand side of the signal line 402, the second side of the signal line 402 may be the right-hand side of the signal line 402. The third reference plane 408 and the fourth reference plane 410 are disposed on a same surface of the substrate 401. Nevertheless, the disclosure is not limited thereto, the third reference plane 408 and the fourth reference plane 410 may also be disposed on different surfaces of the substrate 401. In an embodiment of the disclosure, the third reference plane 408 and the fourth reference plane 410 are disposed along the signal transmission of the signal line 402. It should be noted that the first reference plane 404, the second reference plane 406, the third reference plane 408 and the fourth reference plane 410 may be disposed on a same surface of the substrate 401 or in different surfaces of the substrate 401.

The third reference plane 408 receives a third DC voltage and the fourth reference plane 410 receives a fourth DC voltage, where a voltage level of the third DC voltage may be equal to or different from a voltage level of the fourth DC voltage. For example, the third reference plane 408 may receive a ground voltage (e.g., 0V) and the fourth reference plane 410 may receive the power voltage (e.g., 5V, 10V), and vice versa. In another embodiment, both of the third reference plane 408 and the fourth reference plane 410 may receive a same voltage (e.g., 0V or 5V). It should be noted that voltage levels of the first, second, third and fourth DC voltages may be the same or different from each other.

The second passive component 405 is coupled between the third reference plane 408 and the fourth reference plane 410. The second passive component 405 may be similar to the first passive components 203 and 303 that are shown in FIGS. 2 and 3A-3C of the present disclosure. The second passive component 405 may comprise at least one capacitor, or at least one inductor, or at least one diode, or any combination thereof. The constructive components (e.g., at least one capacitor, at least one inductor, at least one diode, or any combination thereof) of the second passive component 405 may be coupled to each other in series or in parallel. The detailed disclosure of the second passive component 405 may be deduced from the above descriptions of the first passive components 203 and 303 illustrated in FIGS. 2 and 3A-3C, and thus, the detailed description of the passive component 405 is omitted herein.

When a high-frequency signal is transmitted on the signal line 402, the first passive component 403 and the second passive component 405 act as short circuits between the reference planes. In this way, the first and second reference planes 404 and 406 are connected to each other without raising impedance discontinuity in the CPW transmission line, and the third and fourth reference planes 408 and 410 are connected to each other without raising impedance discontinuity in the CPW transmission line. Accordingly, the impedance continuity of the CPW transmission line are remained.

Figure 5:
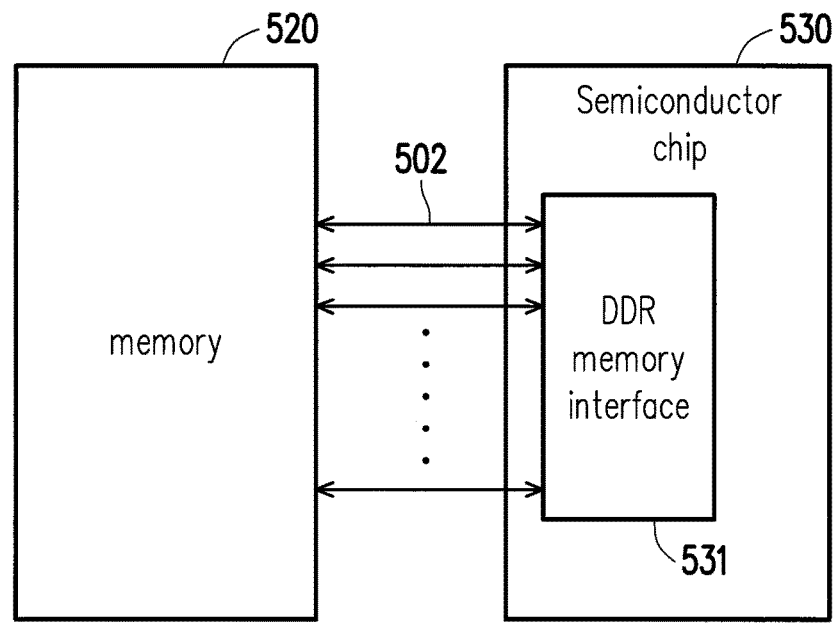
FIG. 5 is a schematic diagram illustrating an electronic apparatus comprising a memory and a semiconductor chip according to an exemplary embodiment of the disclosure.

FIG. 5 is a schematic diagram illustrating an electronic apparatus according to an exemplary embodiment of the disclosure. Referring to FIG. 5, the electronic apparatus 500 includes a substrate (not shown), a memory 520, a semiconductor chip 530, and a plurality of signal lines 502 in the form of CPW transmission line. The CPW transmission line used in the electronic apparatus 500 does not only include the signal line 502 but also includes reference planes, and the electronic apparatus 500 further includes passive components (not shown) coupled between the reference planes, which may be similar to those in FIG. 2, 3A-3C, or 4. The memory 520 can be any type of memory (e.g., a volatile memory or a non-volatile memory or a combination thereof) which is used to store data. The semiconductor chip 530 includes a double data rate (DDR) memory interface which is connected to the memory 520 via the plurality of signal lines 502 for accessing the memory 520. The DDR memory interface 531 has a plurality of signal ports, where each of the signal lines 502 connects to one of the plurality of signal ports of the DDR interface 531 and a corresponding signal port of the memory 520.

In an embodiment of the disclosure, the signal ports of the memory 520 and the DDR memory interface 531 includes the following types of signal port: data signal port (DQ), data strobe port (DQS), data mask port (DM), control port (CONTROL) and address port (ADDRESS). The signal lines 502 are used to connect at least one type of signal port of the DDR memory interface 531 to the corresponding port of the memory 520. By using the passive component(s) coupled between the reference planes at the same side of the signal line, the CPW transmission line of the electronic apparatus 500 has capabilities of reducing the impedance discontinuity and improving signal transmission efficiency through the CPW transmission line.

In summary, the embodiments of the disclosure provide an electronic device having a CPW transmission line where at least one passive component is electrically connected between reference planes of the CPW transmission line. At relatively high frequencies, the passive component acts as a short circuit to electrically connect the reference planes of the CPW transmission line without raising impedance discontinuity. In this way, the impedance continuity of the CPW transmission line are remained and the signal transmission efficiency is improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electronic apparatus, comprising:
   a substrate;
   a coplanar waveguide transmission line, disposed on a surface of the substrate, and comprising a signal line, a first reference plane and a second reference plane, wherein the first reference plane and the second reference plane are at a first side of the signal line;
   a first passive component, disposed on the surface of the substrate and coupled between the first reference plane and the second reference plane;
   a memory; and
   a semiconductor chip, having a double data rate (DDR) memory interface, and being able to access the memory via the DDR memory interface,
   wherein, the first reference plane and the second reference plane are respectively coupled to a first direct current (DC) voltage and a second DC voltage, and the signal line of the coplanar waveguide transmission line connects one of a plurality of signal ports of the DDR interface of the semiconductor chip and a corresponding signal port of the memory.

2. The electronic apparatus according to claim 1, wherein a voltage level of the first DC voltage is different from a voltage level of the second DC voltage.

3. The electronic apparatus according to claim 1, wherein a voltage level of the first DC voltage equals a voltage level of the second DC voltage.

4. The electronic apparatus according to claim 1, wherein the first reference plane and the second reference plane are disposed along a signal transmission direction of the signal line.

5. The electronic apparatus according to claim 1, wherein the first passive component comprises a capacitor.

6. The electronic apparatus according to claim 1, wherein the first passive component is a diode, an anode of the diode is coupled to the first reference plane and a cathode of the diode is coupled to the second reference plane, and a voltage level of the first DC voltage is lower than a voltage level of the second DC voltage.

7. The electronic apparatus according to claim 1, wherein the coplanar waveguide transmission line further comprises:

a third reference plane and a fourth reference plane, disposed on the substrate and at a second side of the signal line different from the first side, and are respectively coupled to a third DC voltage and a fourth DC voltage; and wherein the electronic apparatus further comprises a second passive component, coupled between the third reference plane and the fourth reference plane.

8. The electronic apparatus according to claim 7, wherein the third DC voltage is different from the fourth DC voltage.

9. The electronic apparatus according to claim 7, wherein a voltage level of the third DC voltage equals a voltage level of the fourth DC voltage.

10. The electronic apparatus according to claim 7, wherein voltage levels of the first DC voltage, the second DC voltage, the third DC voltage and the fourth DC voltage are different.

11. The electronic apparatus according to claim 7, wherein the third reference plane and the fourth reference plane are disposed along a signal transmission direction of the signal line.

12. The electronic apparatus according to claim 7, wherein the signal line, the third reference plane and the fourth reference plane are disposed on a same surface of the substrate.

13. The electronic apparatus according to claim 12, wherein the signal line, the first reference plane and the second reference plane are disposed on the same surface of the substrate.

14. The electronic apparatus according to claim 7, wherein the second passive component is a capacitor.

15. The electronic apparatus according to claim 7, wherein the second passive component is a diode, an anode of the diode is coupled to the first reference plane and a cathode of the diode is coupled to the second reference plane, and a voltage level of the third DC voltage is lower than a voltage level of the fourth DC voltage.

* * * * *